United States Patent [19]

Peterson et al.

[11] Patent Number: 5,702,767
[45] Date of Patent: Dec. 30, 1997

[54] NON-AMINIC PHOTORESIST ADHESION PROMOTERS FOR MICROELECTRONIC APPLICATIONS

[75] Inventors: William R. Peterson, Phoenix, Ariz.; Craig M. Stauffer, Sunnyvale, Calif.

[73] Assignee: Complex Fluid Systems, Inc., Santa Clara, Calif.

[21] Appl. No.: 562,725

[22] Filed: Nov. 27, 1995

Related U.S. Application Data

[63] Continuation of Ser. No. 343,163, Nov. 22, 1994, abandoned.

[51] Int. Cl.$^6$ .................... B05D 1/36; B05D 3/04; B05D 5/00
[52] U.S. Cl. .................... 427/407.1; 427/255; 427/255.4; 427/255.6; 427/294; 427/387; 427/407.2; 427/409
[58] Field of Search .................... 427/96, 255, 387, 427/407.1, 409, 407.2, 255.4, 255.6, 294, 295

[56] References Cited

U.S. PATENT DOCUMENTS

| | | | |
|---|---|---|---|
| 3,920,714 | 11/1975 | Streck | 260/448.2 E |
| 4,497,890 | 2/1985 | Helbert | 427/409 |
| 4,558,393 | 12/1985 | Tanaka et al. | 361/286 |
| 4,585,884 | 4/1986 | Lin et al. | 536/413 |
| 4,613,398 | 9/1986 | Chiong et al. | 427/488 |
| 4,726,877 | 2/1988 | Fryd et al. | 427/272 |
| 4,782,040 | 11/1988 | Revis et al. | 427/387 |
| 4,808,511 | 2/1989 | Holmes | 430/325 |
| 4,837,401 | 6/1989 | Hirose et al. | 525/364 |
| 4,863,557 | 9/1989 | Kokaku | 427/131 |
| 4,999,280 | 3/1991 | Hiraoka | 427/407.1 |
| 5,143,855 | 9/1992 | Pace et al. | 437/3 |
| 5,151,402 | 9/1992 | Craw et al. | 502/401 |
| 5,185,210 | 2/1993 | Zupancic | 427/510 |
| 5,208,067 | 5/1993 | Jones et al. | 427/96 |
| 5,212,044 | 5/1993 | Liag et al. | 430/192 |
| 5,449,558 | 9/1995 | Hasegawa et al. | 428/422 |

*Primary Examiner*—Diana Dudash
*Attorney, Agent, or Firm*—Panitch Schwarze Jacobs & Nadel, P.C.

[57] ABSTRACT

A method for providing an inorganic substrate having improved adherence for polymeric films is disclosed. The method entails reacting at least one organosilane compound having at least one alkylsilyl moiety therein and at least one hydrolyzable group capable of reacting with the substrate to silylate the substrate. Hydrolyzable by-products from the reaction, if any, have a pH less than or equal to about 7.

20 Claims, No Drawings

5,702,767

NON-AMINIC PHOTORESIST ADHESION PROMOTERS FOR MICROELECTRONIC APPLICATIONS

CROSS-REFERENCE TO RELATED APPLICATION

This is a continuation of application Ser. No. 08/343,163, filed Nov. 22, 1994, now abandoned.

FIELD OF INVENTION

The invention is directed to treating semiconductor substrates prior to application of photoresists thereon during the manufacture of microelectronic devices.

BACKGROUND OF THE INVENTION

The microelectronics industry influences all aspects of modern day economies. At the center of this industry are microelectronic devices commonly referred to as chips. Improvements in design and materials in recent years have increased the performance of chips from containing a few thousand transistors to millions of transistors in approximately the same chip size. Microelectronic devices in the near future are expected to contain billions of transistors in this same chip size.

Miniaturization to promote greater functionality per unit area of chip has placed tremendous demands on design, as well as the materials and chemistries utilized in manufacture of the chip. An important aspect of the manufacture of these devices entails application of photoactive films i.e., photoresists to the substrate.

Photoresists are applied at all masking levels in manufacture of microelectronic devices. For example, 20–25 masking levels may be employed during the manufacture of commercial devices.

Photoresists have been employed in the fabrication of microelectronic devices throughout the history of the manufacture of these devices. Early device manufacture employed photolithographic techniques in which a photoresist film was placed or coated onto a substrate such as silicon, imaged with light, and developed into a desired pattern with chemical developers. The resulting pattern was used as a selective mask in subsequent operations such as ion implanting, patterning of the underlying substrate, metal plating, as well as various other steps during manufacture of these devices.

Early photoresist application methods presented problems including poor coating of the photoresist onto the substrate, pattern loss due to loss of portions of the photoresists by chemical developers, as well as "undercutting" of the photoresist by chemical developers. Undercutting occurs when an aqueous or organic developer migrates along the interface between a polar substrate and the photoresist to cause the photoresist to lift off the substrate.

The above problems were largely eliminated when hexamethyl-disilazane ("HMDS") was employed to pretreat, i.e.. "prime", the silicon substrates prior to application of the photoresist. Priming the substrates with HMDS was found to promote better photoresist coatings, provide more uniform photoresist films on the substrates, reduce pinholes in those films, as well as to reduce undercutting and lift-off of the photoresist film during development. These improvements were believed due to chemical reaction of HMDS with hydrogen-bonded water molecules on the substrate's surface. As a result, yield of devices has been greatly improved by HMDS, thereby promoting adoption of HMDS as a standard pretreatment by manufacturers.

During priming of silicon substrates with HMDS, initial chemical reaction of the HMDS with the hydrogen-bonded water molecules produces ammonia, trimethylsilanol and hexamethyldisiloxane. Subsequent reaction of HMDS with hydroxyl and oxide groups on the surface of the substrate produces a trimethylsiloxy substituted, i.e., silylated surface. The silylated surface is believed to reduce the number of surface polar groups, reduce the surface energy and provide an essentially monomolecular organic coating on the substrate which is compatible with organic photoresists. H. Yanazawa, *Colloids And Surfaces*, vol. 9, pp. 133–145, (1984), describes that the interaction between the organic photoresist and the primed substrate surface is probably of hydrophobic nature. The hydrophobic trimethylsilyl groups on the substrate also repel polar groups such as are present in water and aqueous developers to prevent undercutting at the substrate-photoresist interface.

As is known in the art, production of a silylated surface occurs when a reactive silicon compound in the silylating agent reacts with a protic species on the surface of the substrate to produce a silicon compound bonded to the protic species, as well as a protonated, non-bonded by-product. The degree of surface silylation achieved during priming with materials such as HMDS can be gauged by measuring "surface contact angle". As is known, the higher the contact angle, the greater is the extent of silylation. As is also known, surface contact angle can be measured by focusing a commercially available contact angle goniometer on a drop of water placed on the silylated substrate. A high contact angle indicates that greater numbers of silylating groups such as trimethylsilyl groups are bonded to the substrate surface. Prior observations by J. L. Nistler, "A Simple Technique to Analyse Conditions That Affect Submicron Photoresist Adhesion", *KTI Microelectronics Seminar—Interface* '88, pp. 233–247, (1988), ("NISTLER") and by W. Moreau, *Semiconductor Lithography: Principles, Practices, and Materials*, Plenum Press, New York, (1988), ("MOREAU") on substrates such as silicon, silicon dioxide and silicon nitride indicate that a contact angle of 65–85 degrees is desirable since dewetting of the photoresist can occur above and below these contact angles.

Improvements to using HMDS to "prime" a substrate involve applying liquid HMDS neat, HMDS diluted with one or more solvents, and vapor priming wherein vapors of HMDS are applied to the surface of a substrate. As known in the art, vapor priming can be performed by treating batches of wafers in an oven, or by treating individual wafers on an in-line track system. Both methods entail heating the wafers under vacuum, whereafter HMDS vapor is introduced onto the wafers.

Generally, priming enables acceptable photoresist films or other organic-based films to be applied to the primed substrate in subsequent steps. An acceptable photoresist film is a continuous, uniform film that does not exhibit pinholes, edge pullback, beading, blistering, lift off or "pop" during exposure, and does not exhibit significant lifting or undercutting during chemical development. Vapor priming is a preferred method for pretreating substrates in the manufacture of high density microelectronic devices.

HMDS is the most popular agent for priming of wafers. Other agents which have been used to prime substrates include trimethylsilyldiethylamine (TMSDEA) and trimethylsilyldimethylamine (TMSDMA). Priming with HMDS, TMSDEA, and TMSDMA, however, can generate basic by-products of ammonia, diethylamine and dimethylamine which can negatively affect high resolution photoresists.

High resolution photoresists are typically positive or negative aqueous developable compositions which have been chemically amplified. These photoresists, upon exposure to radiation such as photons, electrons or ions at wavelengths of from a few nanometers (X-ray) to about 450 nm, generate minute amounts of acids from compounds such as diazonapthaquinones, onium salts, diazoacetoacetates and diazoketones which may be present in the photoresist composition. These acids are useful to perform reactive functions during subsequent steps in the manufacture of the chip. These reactive functions include, for example, hydrolysis of protecting groups, molecular weight modification, and/or cross-linking to increase molecular weight and density of the photoresist. These reactive functions typically occur after exposure of the photoresist to radiation in a post-exposure baking step prior to developing the photoresist.

Recently, it was discovered by S. MacDonald et al., *Proc. SPIE*, 1466;, 2–7 (1991), by W. Hinsberg et al in *Proc. SPIE*, 1672, 24–32 (1992) and W. Hinsberg et al. in *PMSE Preprints*, ACS National Meeting, San Francisco, Calif., (1992), that the acids generated in the photoresist can react with trace amounts of residual amines, ammonia or other nitrogen-containing by-products generated by priming and which remain on the substrate surface and in the manufacturing atmosphere surrounding the substrate. These by-products, can undesirably neutralize the acids generated by the photoresist and thereby adversely affect the quality of the photoresist.

High resolution photoresists typically employed in the manufacture of high density microelectronic devices are deep ultraviolet, chemically amplified resists ("DUV-CARS"). Ammonia and amine-containing by-products generated during priming can be especially deleterious to DUV-CARS. It has been reported by MacDonald et al., *Proc. SPIE*, 1466:2–7 (1991), that a fifteen minute exposure of DUV-CAR photoresists to 15 ppb amines causes scumming or capping. The presence of basic by-products and volatile clean room contaminants which are ammonia or amines or amine by-products have been reported by A. Muller et al. in Solid State Technology, pp. 61–72, September, 1994, to neutralize acid groups at the resist surface causing a skin on the resist surface ("scumming"), degraded line width control and, therefore, decreased critical dimension ("CD") control, decreased device yield and decreased process reliability.

Various methods have been introduced to address the undesirable effects caused by amine and ammonia compounds and by-products. Topcoats which provide a barrier coating over the photoresist to prevent contact of the acids generated in the photoresist with residual ammonia and amine by-products produced during priming with compounds such as HMDS are recommended by resist manufacturers such as IBM, OCG, Shin-Etsu and JSR in their applications literature. Volatile amines or ammonia have been shown by Berro et al. in J.I.E.S., (November/December 1993), and D. Kinkhead et al. in *Microcontamination*, p. 37 (June 1993), to form crystalline-like amine salts on wafer surfaces. Installation of acidic ion filters or scrubbing of air with acidic solutions in the manufacturing facilities' air supply/exhaust recirculation system has also been employed to reduce ammonia contamination. Removal of airborne ammonia by activated carbon filtration has also been attempted. These methods, however, are expensive and have met with marginal success in control and removal of ammonia/amine contaminants.

A need therefore continues for more reliable and efficient methods to reduce the amount of basic ammonia/amine-type contaminates generated during manufacture of microelectronic devices.

SUMMARY OF THE INVENTION

According to the invention, it has been discovered that selected organosilane compounds can be employed to silylate a substrate to impart a molecular coating substantially equivalent to that obtained with HMDS, but without generating undesirable basic by-products such as ammonia, or amine-type compounds. Substrates which can be silylated include but are not limited to single crystal silicon, polysilicon, silicon dioxide, silicon nitride, aluminum, aluminum oxide, copper, copper oxide, titanium, titanium nitride, titanium tungsten, boron phosphorus silicon glass, spin-on-glass, and silicides. Application of the selected organosilane compounds does not interfere with effective functioning of acids generated in photoresists, including chemically amplified resists. Application of these selected organosilane compounds also promotes uniform coating and bonding of photoresists to the substrate.

The invention employs selected organosilanes to silylate the surfaces of substrates such as silicon to promote effective application of a photoresist layer onto those surfaces. The invention solves long-standing problems in the art associated with generation of ammonia and amine-containing by-products generated during priming of substrates. The invention also substantially completely eliminates overpriming and underpriming to enable controllable, reproducible priming by presently available equipment with little or no modification and in shorter time periods with improved materials economics.

In accordance with the invention, a method for substantially eliminating contamination of silylated substrates with basic by-products to yield improved bonding of polymeric films such as photoresists to a substrate surface is provided. The method comprises reacting at least one organosilane compound, especially trialkylsilane compounds and dialkylsilane compounds, with a substrate to silylate the substrate. The organosilane compound includes hydrolyzable leaving groups which are capable of generating by-products which have a pH less than seven.

Various photoresists can be applied to the silylated surfaces produced by the selected organosilanes employed in the invention. These photoresists include, for example, those compositions which contain compounds such as polyvinylphenol, polyhydroxystyrene, poly(t-butylcarboxy) styrene, polyfumerates, poly(t-butoxystyrene), polyisoprenes, formaldehyde novolacs, and polyacrylic esters, as well as blends and copolymers thereof with cross-linking materials such as cyanurates, and a photoinitiator, such as onium salts, diazonaphthenates, and azides.

Especially useful organosilanes for use as silylating agents in the invention are trialkylsilanes of the formula:

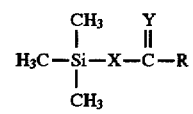

wherein
X is O or NR$^1$;
Y is O, CH$_2$, CHR, CHOR, CRR or NR$_1$;
R is any of hydrogen, C$_1$–C$_8$ saturated alkyl, especially C$_1$–C$_2$ saturated alkyl; C$_4$–C$_6$ saturated cyclic alkyl, especially C$_6$ saturated cyclic alkyl; C$_1$–C$_8$ unsaturated alkyl, especially C$_2$–C$_4$ unsaturated alkyl; unsaturated C$_4$–C$_8$ cyclic alkyl, especially C$_5$–C$_6$ unsaturated cyclic alkyl; C$_2$–C$_{10}$ fluorinated hydrocarbon alkyl, especially C$_2$–C$_3$ fluorinated hydrocarbon alkyl; fluorinated alkyl, especially C$_1$–C$_2$ fluorinated alkyl; C$_5$–C$_8$ fluorinated cyclic alkyl, especially C$_5$–C$_6$ fluorinated cyclic alkyl; C$_1$–C$_3$trialkylsiloxy, especially Me$_3$SiO; trialkylsilyl, especially Me₃Si; $C_1$-$C_{12}$ alkoxy, especially $C_1$-$C_2$ alkoxy; phenyl, phenethyl, acetyl, 1-propanol, 2-propanol, alkyl ketones such as $C_2$-$C_6$ 1- and 2-alkyl- ketones, especially acetyl 2-propanonyl; $C_3$-$C_6$ alpha acetyl esters, especially methylacetyl;

and $R^1$ is any of hydrogen, methyl, trifluoromethyl, trifluoromethylethyl, or trimethylsilyl.

Particularly useful trialkylsilanes include those of the formula:

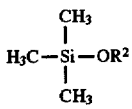

where $R^2$ is any of saturated alkyl such as $C_1$-$C_6$ alkyl, especially methyl, ethyl; unsaturated alkyl such as $C_2$-$C_8$ unsaturated alkyl, especially vinyl, allyl; cyclic alkyl such as $C_3$-$C_8$ cyclic alkyl, especially cyclopentyl, cyclohexyl; unsaturated cyclic alkenes such as $C_4$-$C_8$ unsaturated cyclic alkenes, especially cyclopentenyl, cyclohexenyl; fluoroalkyl such as $C_1$-$C_8$ fluoroalkyl alkyl, especially trifluoroethyl; phenyl, fluorinated phenyl such as fluorinated alkyl phenyl and fluorophenyl, especially pentafluorophenyl; alkyl ethers such as ethylene glycol alkyl and propylene glycol alkyl ethers, especially ethylene glycol methyl ether; alkyl ketones such as $C_2$-$C_8$ alpha keto alkenes, especially methacroyl; saturated fluorinated alkyl ethers such as $C_3$-$C_8$ perfluoroalkyloxy alkyls, especially trifluoromethyloxyethylene; unsaturated fluorinated alkyl ethers such as 1-perfluoroalkyl-1-alkoxy ethylenes, especially 1-trifluoromethyl-1-ethoxyethylene. Other 10 trialkylsilanes which are particularly useful in the invention include those of the formula:

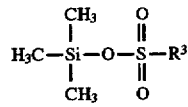

wherein $R^3$ is any of saturated alkyl such as straight or branched chain alkyl, especially methyl; and saturated fluoroalkyl such as trifluoroalkyl, especially trifluoromethyl.

Particularly useful trialkylsilanes for use as silylating agents in the invention include O-trimethylsilyl-acetate (OTMSA), O-trimethylsilylproprionate (OTMSP), O-trimethylsilylbutyrate, trimethylsilyltrifluoroacetate (TMTFA), tri-methylmethoxysilane (TMMS), N-methyl-N-trimethyl-silyltrifluoroacetamide (MSTFA), O-trimethylsilylacetylacetone (OTMAA), isopropenoxytrimethylsilane (IPTMS), bis(trimethylsilyl)trifluoroacetamide (BSA), methyltrimethylsilyldimethylketone acetate (MTDA) trimethylethoxysilane (TMES).

Dialkylsilanes wherein the silicon atom is attached to two reactive hydrolyzable groups, which on reaction with the substrate provide an organosilane compound on the substrate while generating substantially only acidic or neutral by-products, also may be employed as silylating agents in the invention. Particularly useful dialkylsilanes include dimethyldimethoxysilane and dimethyldiacetoxysilane.

The organosilanes employed in the invention may be applied to the substrate by any one of vapor, liquid, or solutions containing the organosilane at temperatures from about ambient to about 250° F. and at pressures from about atmospheric pressure to less than about 1 torr. The organosilane can also be admixed with a photoresist and the mixture applied to the substrate to provide a uniform film on the substrate.

In another aspect of the invention, a silylated substrate which has adherence for polymeric coatings, such as photoresists, that is at least equal to the adherence achieved by HMDS silylating agents is provided.

DETAILED DESCRIPTION OF THE EMBODIMENT

Generally, the selected organosilanes employed in the invention have in their molecular structure at least one reactive, hydrolyzable leaving group bonded to a silicon atom. These organosilanes are alkylsilicon-substituted monomers which contain at least one hydrolyzable leaving group bound to a silicon atom. The leaving group is a chemical moiety such as acetate, carboxylate, enol, alkoxide, sulfate or amide. Upon reaction of the organosilane with the substrate during priming, the organosilane can produce acidic or neutral by-products of reaction depending on the specific hydrolyzable leaving group. These by-products may be described by the Bronsted-Lowry system as the conjugate acids of the organosilane molecule. Classical Arrhenius definition applied to the by-products would be molecules with pH in aqueous solutions of less than or approximately equal to seven.

The selected organosilanes employed in the invention can be applied neat as liquids, or as solutions in organic solvents such as xylene or propylene glycol methyl ether acetate (PGMEA). The selected organosilanes also can be employed as mixtures with each other. These selected organosilanes also can be applied neat as vapors, or as vapors in admixture with gaseous carriers such as nitrogen and inert gases such as argon. During application, the selected organosilanes are injected as liquid or vapor into a low pressure silylation area through an orifice, or by spraying the organosilane into a heated area where the resulting vapor is transported by inert gas or vacuum to the substrate to be treated.

Although not wishing to be bound by theory, it is believed that hydrogen ion transfer occurs during priming of a substrate as in reaction (I):

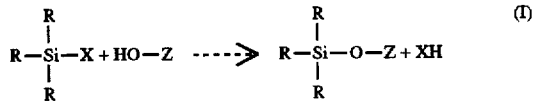

where

R=methyl

Z=substrate composition

X=leaving group

As shown in (I), during priming of a substrate such as silicon, the organosilanes employed in the invention are believed to react with the substrate to form a surface layer of alkylsilyl groups, especially trimethylsilyl groups, of approximately one molecule thick on the substrate surface. Although not wishing to be bound by theory, it is believed that the leaving group of the organosilane, during reaction with hydrogen-bonded surface water, hydroxyl groups or similar reactive species on the substrate surface accept a proton to produce, for example, a trimethylsilyl group bound to the substrate. The reaction also is believed to produce by-products such as acids, alcohols, ketones and amides which have neutral or acidic properties depending on the hydrolyzable leaving group in the organosilane. These by-products can be represented by (II):

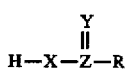

where
X is O, NR¹ or CH₂;
Y is O or NR¹;
Z is C or S=O, and
R is H, $C_1$-$C_8$ saturated alkyl, $C_2$-$C_8$ unsaturated alkyl, $C_4$-$C_6$ unsaturated cyclic alkyl, phenyl, $C_1$-$C_8$ saturated fluoroalkyl, fluorine containing phenyl such as trifluoromethylphenyl, phenethyl, alkyl ketone such as acetylmethyl, trialkylsiloxy such as trimethylsiloxy, alkenylalkylether such as 1-trifluoromethyl-1-methoxyethylene, trialkylsilyl such as trimethylsilyl, trialkylsilyloxyenolic alkyl such as 2-trimethylsiloxyprop-1-enyl and $C_1$-$C_8$ alkoxy, and

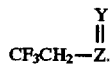

The silylated organosilanes employed in the invention can be applied neat as liquid or vapor, preferably vapor, to a substrate. The organosilanes can also be employed as solutions in solvents such as hydrocarbons and ether esters and the solutions can be applied as liquids or vapors to the substrate. Useful hydrocarbon solvents include alkanes such as hexane, octane, and the like as well as aromatic solvents such as xylene, toluene and the like. Useful ether esters include ethylene glycol methyl ether acetate, propylene glycol methyl ether acetate and the like.

Organosilanes suitable for use in the invention include O-trimethylsilyl-acetate (OTMSA), O-trimethylsilylproprionate (OTMSP), O-trimethylsilylbutyrate, trimethylsilyltrifluoroacetate (TMTFA), trimethylmethoxysilane (TMMS), N-methyl-N-trimethylsilyltrifluoroacetamide (MSTFA), methyl-3-(trimethylsiloxy) crotonate, bis(trimethylsilyl)acetamide, bis(trimethylsilyl)adipate, bis(trimethylsilyl) trifluoroacetamide, 3-trimethylsilyl-2-oxazoladinone, trimethylsilylformate, O-trimethylsilylacetylacetone (OTMAA), isopropenoxytrimethylsilane (IPTMS), bis (trimethylsilyl)trifluoroacetamide (BSA), methyltrimethylsilyldimethylketone acetate (MTDA) trimethylethoxysilane (TMES). Other organosilanes which may be employed include O-trimethylsilylmethacrylate, 2-trimethylsiloxypent-2-ene-4-one, 1-(trimethylsiloxy) cyclohexene. All of these compounds are commercially available.

Additional compounds which can be employed as the selected silanes in the invention include commercially available isopropenoxytrimethylsilane and organosilylsulfonates of the formula:

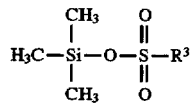

where $R^3$ is $C_1$-$C_4$ alkyl or $C_1$-$C_4$ fluoroalkyl. Especially suitable organosilylsulfonates include trimethylsilylmethanesulfonate and trimethylsilyltrifluoromethylsulfonate.

As mentioned, solutions of the selected organosilanes in organic solvents can be employed as silylating agents. Suitable organic solvents for use with these organosilanes include aliphatic hydrocarbons such as n-octane, hexane and the like; aromatic hydrocarbons such as toluene, xylene and the like;, aliphatic ethers such as methoxy ethylether, diglyme and the like; and ether esters such as propylene glycol methyletheracetate (PGMEA), ethylene glycol methyl ether acetate and the like.

Solutions of the selected organosilanes employed in the invention may include one or more of the aforementioned selected organosilanes with one or more organic solvents in a mixture of from about 1:99 to 99:1. A desirable solution includes OTMSA and PGMEA in a ratio of from about 1:99 to 99:10TMSA to PGMEA, preferably about 20:80 OTMSA to PGMEA.

The selected organosilanes employed in the invention can be applied to silylate a substrate prior to applying a photoresist to the substrate in a wide range of concentrations and mixture ratios dependent on the substrate composition, process temperatures, and equipment. Specific conditions for applying the photoresist can be determined by those skilled in the art.

Substrates which can be treated in accordance with the invention include, but are not limited to, prime silicon wafers and silicon wafers having chemically or thermally generated oxide surfaces thereon. As used herein, prime silicon wafers are understood to mean unused silicon wafers which are taken directly from the manufacturer's shipment. Other substrates which can be treated in accordance with the invention include chemical glasses such as borophosphorus silicate glass (BPSG), metal layers such as aluminum, titanium, tungsten, copper, and chrome, silicon dioxide, silicon monoxide, chrome oxide, silicon nitride, aluminum oxide, titanium oxide, copper oxide, as well as various metal silicides such as aluminum silicide deposited on silicon nitride and titanium nitride.

Silylating of a substrate by direct vapor application of one or more of the selected organosilanes employed in the invention can be performed with commercially available vapor priming equipment. Examples of useful priming equipment include Genesis Microstar 200, Genesis 2020 vapor prime unit, Genesis 2010 vapor prime unit, Genesis 2002 vapor prime oven, Yield Engineering Systems, Inc. priming equipment, in-line vapor track systems such as those manufactured by Silicon Valley Group, and liquid dispenser track systems.

Silylating by direct vapor application, as is known in the art, is performed by transporting a mixture of vapors of one or more of the selected organosilanes in gases such as nitrogen or argon within vapor priming equipment, or by differential pressure flow of vapors of the organosilanes in vapor priming equipment to the substrate to be silylated. The specific amounts of the selected organosilane compound employed in the vapor mixture can vary from about 10 to 100,000 ppm depending on the system, flow, exposure time and vacuum employed.

Silylation by direct application of vapor to the substrate can be performed at temperatures of about 10° C. to about 200° C., preferably about 50° C. to about 150° C. Silylation in accordance with the invention enables uniform organic films to be deposited onto the silylated surface of the substrate. Examples of films which can be deposited over the silylated surface include photoresists, silicon polyimides such as those products produced by Amoco Chemical Co. and Micro SI Inc., especially ALTISIL 115, 129, 1000 and 2000, polyacrylates such as any of those mentioned above and including polymethylmethacrylate polyimides such as those commercial products produced by Amoco Chemical Co., Dupont Electronics, National Starch and Chemical Co., to name but a few, novolac-based films such as those products produced by Micro SI Inc., OCG Microelectronic Materials, Inc., Shipley Co., Inc., and planarizing layers such as those produced by Filmtronics, Futurrex, OCG Microelectronic Materials, Inc., and Dow Chemical Co.

Photoresists can be applied to the silylated surfaces produced by the selected organosilanes employed in the invention by methods known in the art. These photoresists are typically high resolution positive or negative tone, chemically amplified compositions which contain acyanurate and a photoinitiator. Useful photoresists include organic solutions of photoactivated polymers which contain photoinitiators. Useful photoinitiators include onium salts or mixtures such as diaryliodonium, arylalkyliodonium, triarylsulfonium, arylakylsulfonium, trialkylsulfonium hexafluorophosphates, hexafluoroarsenates, hexafluoroantimonates and tosylates, especially 4-thiophenoxyphenyl diphenyl sulfonium hexafluoroantimonate, di(4-tert-butylphenyl)iodonium hexafluorophosphate and dilauryl-4-t-butylphenylsulfonium hexafluoroantimonate; diazonapthenates,such as diazoquinonesulfonic acids or diazoquinonecarboxylic acids, especially 6-diazo-3,4-dihydro-4-oxo-1-napthene sulfonic acid; and azides,such as bisarylazides, especially 2,bis(4,4$^1$ diazidophenyl-2,2$^1$-ethylene)-4-methylcyclo-hexanone. These photoinitiators are reactive to light between the wavelengths of 436 nm to 190 nm. Examples of useful photoresist compositions include but are not limited to those available from Shipley Co., Inc., Hoechst Celanese Corp. (AZ Photoproducts Division), Tokyo Ohka Chemical Co., Ltd., Shin-Etsu Chemical Co., Ltd., OCG Microelectronic Materials, Japan Synthetic Rubber Co., Ltd., IBM, Hitachi Ltd., and BASF Ltd. Specific photoresists include Shipley's SNR200, SAL601, SAL603, XP-3115, XP8844; IBM's Apex and AST; OCG's Camp 6, BASF ST2; and Hoechst's AZPN114, Ray-PN and JSR'S PFR 1X750.

In an alternative embodiment, the photoresist can be applied in admixture with the organosilanes employed in the invention. A mixture of photoresist material and at least one of the selected organosilanes employed in the invention may be applied to the substrate. Typically, the mixture may be applied by mixing a selected organosilane of this invention with the photoresist material in an amount of 0.1 to 1.0% of the weight of the photoresist solution and applying the solution to spinning substrates as per the photoresist manufacturers' instructions.

The photoresists can be applied to a substrate silylated with the organosilanes employed in the invention in a predefined pattern and thereafter developed by known methods. Typically, these methods entail exposing the photoresist to photons (including X-rays), ions or electrons of various wavelengths to form a film. The film then is chemically reacted with aqueous or organic developers.

The present invention wherein the selected organosilane compounds are employed as silylating agents provides significant advantages over the art. The selected organosilanes do not generate undesirable basic by-products such as ammonia or dialkylamines. The invention thereby may provide higher throughput, greater CD control, elimination of the need to apply additional barrier coats to protect the photoresist, reduced silylating times, as well as longer queue times to reduce the load placed on air purification systems. The invention also enables controllable surface silylation of wafers at rates superior to that of HMDS but without generating undesirable basic by-products such ammonia.

The silylating effectiveness of the selected organosilanes employed in the invention in both liquid and vapor form is given in Tables I and II, respectively. Additional illustrations are given in Examples 1-23. Priming effectiveness is gauged by measuring the contact angles with an Arthur H. Thomas goniometer available from Arthur H. Thomas Co. using the procedure reported in NISTLER and in MOREAU mentioned above. Contact angle measurement is given by A. W. Adamson, Physical Chemistry of Surfaces, 4th ed., Wiley Interscience, N.Y., 1982. Higher contact angles denote greater degrees of silylation, i.e. priming effectiveness. Contact angles greater than 85°, however, indicate overpriming which can lead to loss of photoresist adhesion and blistering during exposure to chemical developers. None of the selected organosilanes employed in the invention generates contact angles greater than 85° under the conditions employed.

TABLE I

LIQUID PRIMING RESULTS

| RUN NO. | PRIMING COMPOUND | SUBSTRATE | CONTACT ANGLE (AV.)[1] | pH OF BY-PRODUCT |
|---|---|---|---|---|
| 1 | MSTFA | Silicon | 69° | Neutral |
| 2 | TMTFA | Silicon | 71° | Acid |
| 3 | DEATS | Silicon | 77° | Base |
| 4 | FAST HMDS[2] | Silicon | 58° | Base |
| 5 | None (Control) | $SiO_2$[3] | <15°[4] | N/A |
| 6 | HMDS | $SiO_2$[3] | 63° | Base |
| 7 | OTMSA | $SiO_2$[3] | 70° | Acid |
| 8 | IPTMS | $SiO_2$[3] | 63° | Neutral |
| 9 | DEATS | $SiO_2$[3] | 80° | Base |
| 10 | MSTFA | $SiO_2$[3] | 74° | Neutral |

[1]Contact angles run on Arthur H. Thomas goniometer.
[2]Fast HMDS ™, available from Silicon Resources, Inc., contains a mixture of DEATS and HMDS
[3]Silicon dioxide (thermal).
[4]Contact angle estimated since contact angles below 15° are difficult to measure.

Each of the substrates in Table I is primed under the following identical conditions on 100 mm diameter prime wafers, three wafers per run: Priming is performed by treating a stationary wafer to a ten sec. flood of the liquid silylating agent. The wafer then is ramped to 2000 rpm for thirty seconds.

In the runs shown in Table II, vapor priming with organosilanes in accordance with the invention is performed in a Genesis 2020 vapor prime unit fitted with Hot Block™ adaptor of Genesis Co. using the time periods and temperatures given in Table II.

TABLE II

VAPOR PRIMING RESULTS

| RUN NO. | PRIMING AGENT | SUBSTRATE | TIME (SEC.) | TEMP (°C.) | CONTACT ANGLE |
|---|---|---|---|---|---|
| 1 | None | Si[1] | N/A | N/A | 30° |
| 2 | HMDS | Si[1] | 60 | 50 | 47° |
| 3 | OTMSA | Si[1] | 60 | 50 | 54° |
| 4 | DEATS | Si[1] | 60 | 50 | 84° |
| 5 | MSTFA | Si[1] | 60 | 50 | 70° |
| 6 | IPTMS | Si[1] | 60 | 50 | 51° |
| 7 | HMDS | Si[1] | 30 | 50 | 45° |
| 8 | OTMSA | Si[1] | 30 | 50 | 50° |
| 9 | OTMSA | $SiO_2$[2] | 30 | 100 | 58° |
| 10 | DEATS | $SiO_2$[2] | 30 | 100 | 83° |
| 11 | None | SiN[4] | — | — | <10°[3] |
| 12 | OTMSA | SiN[4] | 30 | 50 | 56° |
| 13 | MSTFA | SiN[4] | 30 | 50 | 72° |
| 14 | HMDS | SiN[4] | 30 | 50 | 54° |
| 15 | DEATS | SiN[4] | 30 | 50 | 82° |
| 16 | HMDS | Poly[5] | 60 | 100 | 70° |
| 17 | OTMSA | Poly[5] | 80 | 100 | 72° |

TABLE II-continued

VAPOR PRIMING RESULTS

| RUN NO. | PRIMING AGENT | SUBSTRATE | TIME (SEC.) | TEMP (°C.) | CONTACT ANGLE |
|---|---|---|---|---|---|
| 18 | HMDS | BPSG[6] | 15 | 150 | 57° |
| 19 | OTMSA | BPSG[6] | 15 | 150 | 67° |

[1]Prime silicon 100 mm wafer.
[2]Silicon dioxide thermally grown on 100 mm silicon wafer.
[3]Contact angle is estimated because contact angles less than 15° are difficult to measure.
[4]Silicon nitride cleaned in O₂ plasma before priming.
[5]Polysilicon.
[6]Borophosphorous silicon glass.

The contact angle measurements in Tables I and II show that the extent of silylation achieved by the organosilanes employed in the invention, whether as liquid or vapor, is equal to or greater than that achieved by HMDS.

The invention has special utility for manufacture of microelectronic and semiconductor devices. The invention, however can be employed in any process that requires adhering of a polymeric film such as a photoresist to a substrate surface. Examples of these processes include preparation of photomasks on any of glass or quartz substrates, circuit boards, thin film heads, sensors, TF Transistors and active matrix liquid crystal displays. The invention, moreover, can promote silylation of a variety of substrates suitable for photoresist coating in existing equipment with little or no modification.

The invention will now be described in more detail with reference to the following specific, non-limiting examples:

EXAMPLES 1-3

A set of five commercial 100 mm prime silicon wafers from SEH Co. is treated with liquid semiconductor grade HMDS on a SVG Lithography Systems, Inc. ("SVG") Model No. 8600 coater system under the following conditions:

A stationary wafer is given a 10 sec. flood of undiluted liquid HMDS available from Silicon Resources, Inc. under product code AP010. The wafer then is spun to 500 rpm for 2 sec., and then ramped to 2000 rpm for 30 sec. A baking step is not employed.

A set of five commercial 100 mm prime wafers from the same manufacturing lot is treated with undiluted liquid OTMSA (98% purity) under these same conditions. For comparison, a set of five untreated 100 mm prime silicon wafers is evaluated.

Goniometer readings using an Arthur H. Thomas Co. goniometer are taken on each wafer using the procedure described above. The contact angles are measured and averaged. The results are given in Table III:

TABLE III

| EXAMPLE NO. | SILYLATING AGENT | CONTACT ANGLE |
|---|---|---|
| 1 | HMDS | 44° |
| 2 | OTMSA | 50° |
| 3 | None | 34° |

EXAMPLES 4-6

A set of five commercial 100 mm prime silicon wafers from SEH Co. is treated with a solution of 20% (w/w) HMDS in PGMEA in the SVG track system employed in Examples 1-3. A second set of five 100 mm prime wafers is treated with a solution of 20% (w/w) solution of OTMSA in PGMEA in the track system. Each wafer is treated under the following conditions:

Each wafer is given a ten sec. flood of solution followed by a two sec. spin at 500 rpm and then ramping to 2000 rpm for ten seconds. This is followed by a 15 sec. bake at 100° C.

Results of goniometer contact angle measurements using the procedure described above are given in Table IV:

TABLE IV

| EXAMPLE NO. | SILYLATING AGENT - VAPOR | CONTACT ANGLE |
|---|---|---|
| 4 | 20% (w/w) SOLUTION HMDS in PGMEA | 38° |
| 5 | 20% (w/w) OTMSA in PGMEA | 47° |
| 6 | None | 34° |

The larger contact angle observed for OTMSA solution compared to HMDS solution indicates more efficient silylating with OTMSA.

EXAMPLES 7-8

A set of three prime 100 mm silicon wafers is treated with MSTFA (N-methyltrimethylsilyltrifluoroacetamide—chromatography grade, 98%) in the SVG track system employed in Example 1 by subjecting the wafers to a ten sec. flood of vapor followed by a two sec. spin at 500 rpm and then ramping to 2000 rpm for 30 sec. Each wafer is post baked for 30 sec. at 100° C. An identical number of wafers is treated with HMDS vapor from HMDS available from Silicon Resources, Inc. under product code AP010 under identical conditions.

Contact angle measurements taken with a goniometer as described above are shown in Table V:

TABLE V

| EXAMPLE NO. | SILYLATING AGENT | CONTACT ANGLE |
|---|---|---|
| 7 | MSTFA | 64° |
| 8 | HMDS | 47° |

Moistened alkacid indicating strips placed in the exhaust of the spin cup of the SVG track system showed that exhaust vapors due to use of HMDS had a pH 10-11 for HMDS and a pH 7 for MSTFA.

EXAMPLES 9-11

A set of three prime silicon wafers is treated with HMDS vapor from pure HMDS available Silicon Resources, Inc. under product code AP010. The vapor treatment procedure involves placing the wafers into a Genesis 2020 vapor prime unit fitted with a HOTBLOCK™ adaptor at a pressure of 200 torr as measured by a convection-type vacuum gauge. The dehydration bake cycle of the unit is not employed. Silylating of the wafers for a 60 sec. period begins when temperature equilibrium of 50° C. is achieved within the chamber of the vapor unit.

A second set of three prime silicon wafers is treated with OTMSA (reagent grade, 98% purity) vapor under identical conditions and a third set is treated with vapor from TMS- DEA available from Silicon Resources, Inc. under product code AP001 under identical conditions.

A goniometer is used as described above to measure the contact angles of the treated wafers after 60 seconds of exposure to the vapor. The results are shown in Table VI:

TABLE VI

| EXAMPLE NO. | SILYLATING AGENT | CONTACT ANGLE |
|---|---|---|
| 9 | HMDS | 47° |
| 10 | OTMSA | 54° |
| 11 | TMSDEA | 84° |

EXAMPLES 12–14

OTMSA vapor derived from reagent grade OTMSA, 98% purity is utilized to treat silicon wafers having a silicon nitride surface thereon. The nitrided wafers are obtained from Silica Source Technologies Corp., Tempe, Ariz. Contact angles of the nitrided wafers are measured. Contact angles of wafers after treatment with the OTMSA vapor at 50° C. for 10 seconds, and of wafers after treatment with the OTMSA vapor at 50° C. for 30 seconds also are measured. The contact angles are measured using a goniometer as described above. The results are shown in Table VII:

TABLE VII

| EXAMPLE NO. | SILYLATING AGENT | CONTACT ANGLE |
|---|---|---|
| 12 | NONE | 15°[1] |
| 13 | OTMSA | 50°[2] |
| 14 | OTMSA | 65°[3] |

[1] Contact angle estimated since angles less than about 15° are difficult to measure.
[2] Treatment at 50° C. for 10 seconds.
[3] Treatment at 50° C. for 30 seconds.

EXAMPLES 15–17

A silicon wafer having a silicon dioxide surface thereon obtained from Silica Source Technologies Corp., and having a measured contact angle of less than 15° as determined with a goniometer as described above, is treated with isopropenoxytrimethylsilane (IPTMS) vapor from reagent grade IPTMS, 98% purity at a temperature of 100° C. for 30 seconds in the Genesis 2020 vapor priming unit employed in Example 9. Identical treatment conditions also were used to treat an identical wafer with HMDS vapor. The contact angles measured with a goniometer as described above are given in Table VIII:

TABLE VIII

| EXAMPLE NO. | SILYLATING AGENT | CONTACT ANGLE |
|---|---|---|
| 15 | NONE | 15°[1] |
| 16 | IPTMS | 68° |
| 17 | HMDS | 51° |

[1] Contact angle estimated since angles less than about 15° are difficult to measure.

EXAMPLE 18–19

Prime silicon wafers from SEH Co., previously treated with OTMSA vapor (reagent grade, 98% purity) in a Genesis 2020 vapor prime unit fitted with Genesis HOTBLOCK™ adaptor for 60 secs. at 100° C. and found by goniometer measurement as described above to have a contact angle averaging 72°, are spin-coated with Shipley Co. SNR-200, and soft-baked at 125° C for 60 secs. to produce a film thickness of 1.0 micron. The photoresist film is visually observed to exhibit no edge pull back. The film is exposed at 248 nm on a 0.50 na. GCA XLS-2950 stepper (40 MJ/cm$^2$) with a 60 sec., 130° C. post-exposure through a mask having a target line width of 0.50 µm. The resist is developed with Shipley Co. MF® CD-14. Measurement of the resulting pattern indicated line/space pairs of 0.48 µm for both HMDS and the OTMSA primed wafers. Results are given in Table IX:

TABLE IX

| EXAMPLE NO. | SILYLATING AGENT | RADIATION DOSE | RESULT |
|---|---|---|---|
| 18 | OTMSA | 40 mJ/cm$^{-2}$ | 0.48µ |
| 19 | HMDS | 40 mJ/cm$^{-2}$ | 0.48µ |

The results indicate that OTMSA is equal or better in performance to HMDS and does not change or interfere with resist performance, and that OTMSA can be used interchangeably with HMDS without adverse effects.

EXAMPLES 20–22

A set of two 100 mm silicon wafers coated with a 1.0 µ thick aluminum layer obtained from Silica Source Technologies Corp., Tempe, Ariz. is treated with HMDS available from Silicon Resources, Inc., under product code AP010 at 100° C. for 30 secs. in a Genesis 2020 vapor prime unit fitted with a HOTBLOCK™ adaptor. Using identical conditions, a set of two of the same wafers is treated with OTMSA vapor derived from liquid OTMSA (98%, Wright Chemical CO.), and a set of two of the same wafers is treated with IPTMS vapor obtained from liquid (97% purity) IPTMS. Results of goniometer contact angle measurements using the above-described procedure are given in Table X:

TABLE X

| EXAMPLE NO. | SILYLATING AGENT - VAPOR | CONTACT ANGLE |
|---|---|---|
| 20 | HMDS | 35° |
| 21 | OTMSA | 35° |
| 22 | IPTMS | 38° |

EXAMPLE 23

A 100 mm prime silicon wafer having a goniometer contact angle of 32° as determined using the procedure above is treated with TMTFA vapor derived from liquid TMTFA (97% purity) in the Genesis 2020 vapor prime unit employed in Example 20 for 15 secs. at 50° C. Contact angle as measured by a goniometer as described above indicated a contact angle of 71°.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for improving the adherence of a polymeric material to an inorganic, unprimed substrate comprising,
    priming said substrate with at least one organosilane compound having at least one alkylsilyl moiety and at least one hydrolyzable leaving group bound to silicon;

reacting said at least one organosilane compound during priming with said substrate under conditions sufficient to silylate said substrate with a surface layer comprising the alkylsilyl moiety, wherein said hydrolyzable leaving group reacts with said substrate to form by-products having a pH less than or equal to about 7; and applying said polymeric material to said silylated substrate.

2. The method of claim 1 wherein the substrate is selected from the group consisting of at least one of single crystal silicon, polysilicon, silicon dioxide, silicon nitride, aluminum, aluminum oxide, copper, copper oxide, titanium, titanium nitride, titanium tungsten, boron phosphorus silicon glass, spin-on-glass, and silicides.

3. The method of claim 1 wherein said polymeric material is a photoresist which comprises a polymer selected from the group consisting of polyvinylphenol, polyhydroxystyrene, poly(t-butyl-carboxy) styrene, polyfumerates, poly(t-butoxystyrene), polyisoprenes, formaldehyde novolacs, and polyacrylic esters.

4. The method of claim 3 wherein the photoresist further comprises a cyanurate and a photoinitiator selected from the group consisting of onium salts, diazonaphthenates, and azides.

5. The method of claim 1, wherein the organosilane compound is a trialkylsilane compound.

6. The method according to claim 5, wherein the trialkylsilane compound has the formula:

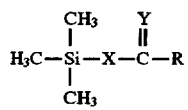

wherein

X is O or NR;

Y is O, CH$_2$, CHR, CHOR, CRR, or NR and

R is hydrogen, saturated C$_1$–C$_8$ alkyl, saturated C$_4$–C$_6$ cyclic alkyl, unsaturated C$_1$–C$_8$ alkyl, unsaturated C$_4$–C$_6$ cylic alkyl, fluorinated C$_2$–C$_{10}$ alkyl, fluorinated C$_5$–C$_8$ cyclic alkyl, trialkylsiloxy, trialkylsilyl, C$_1$–C$_{12}$ alkoxy, phenyl, fluorophenyl, phenethyl, or C$_3$–C$_6$ alkyl ketones.

7. The method according to claim 1 wherein the organosilane compound has the formula:

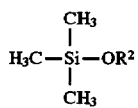

where R$^2$ is saturated C$_1$–C$_6$ alkyl, saturated C$_3$–C$_8$ cyclic alkyl, unsaturated C$_2$–C$_8$ alkyl, unsaturated C$_4$–C$_8$ cyclic alkyl, fluorinated C$_1$–C$_8$ alkyl, fluorinated C$_5$–C$_8$ cyclic alkyl, phenyl, fluorinated phenyl, C$_3$–C$_6$ alkyl ketones, C$_2$–C$_9$ alkyl ether, C$_3$–C$_6$ unsaturated alkyl ketone or, fluorinated alkyl ether.

8. The method of claim 7 wherein R$^2$ is selected from the group consistinq of said fluorinated phenyl and said fluorinated alkyl ether.

9. The method according to claim 7 wherein R$^2$ is trifluoromethyl.

10. The method according to claim 1 wherein the organosilane compound has the formula:

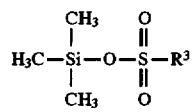

wherein R$^3$ is straight or branched chain saturated alkyl.

11. The method of claim 1 wherein the hydrolyzable group is selected from the group consisting of acetates, carboxylates, enols, alkoxides, sulfates and amides.

12. The method according to claim 5 wherein the trialkylsilane compound is selected from the group consisting of O-trimethylsilylacetate, isopropenoxytrimethylsilane, N-methyltrimethylsilyltrifluoroacetamide, trimethylmethoxysilane and trimethylethoxysilane.

13. The method of claim 1 wherein the organosilane compound is reacted as a vapor with said substrate at temperatures from about ambient to about 250° F. and at pressures from about atmospheric pressure to less than about 1 torr.

14. The method of claim 1 wherein said organosilane is a dialkylsilane having two reactive hydrolyzable groups bound to silicon.

15. The method of claim 14 wherein said dialkylsilane is selected from the group consisting of dimethyldimethoxysilane and dimethyldiacetoxysilane.

16. A method for improving the adherence of a polymeric material to an inorganic, unprimed substrate comprising, priming said substrate with at least one organosilane compound having at least one hydrolyzable leaving group bound to silicon and selected from the group consisting of O-trimethylsilylacetate, O-trimethylsilylproprionate, O-trimethylsilylbutyrate, trimethylsilyltrifluoroacetate, trimethylmethyoxysilane, N-methyltrimethylsilyltrifluoroacetamide, O-trimethylsilylacetylacetone, isopropenoxytrimethylsilane, bis(trimethylsilyl)trifluoroacetamide, methyltrimethylsilyldimethylketone acetate, and trimethylethoxysilane, reacting said at least one organosilane compound during priming with said substrate under conditions sufficient to silylate said substrate, wherein said hydrolyzable leaving group reacts with said substrate to form by-products having a pH less than or equal to about 7; and applying said polymeric material to said silylated substrate.

17. The method of claim 16 wherein said substrate is selected from the group consisting of single crystal silicon, polysilicon, silicon dioxide, silicon nitride, aluminum, aluminum oxide, copper, copper oxide, titanium, titanium nitride, titanium tungsten, boron phosphorus silicon glass, spin-on-glass, metal oxides, and silicides.

18. The method according to claim 1, further comprising priming said substrate with said organosilane compound in a liquid form.

19. The method according to claim 1, further comprising providing said organosilane compound in a solvent solution and priming said substrate with said solution in vapor form.

20. The method according to claim 1 further comprising providing said organosilane compound in a solvent solution and priming said substrate with said solution in liquid form.

* * * * *